(12) United States Patent
Miwa et al.

(10) Patent No.: US 6,259,509 B1
(45) Date of Patent: *Jul. 10, 2001

(54) EXPOSURE APPARATUS AND DEVICE MANUFACTURING METHOD

(75) Inventors: Yoshinori Miwa, Utsunomiya; Yukio Yamane, Tokyo, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,981

(22) Filed: Feb. 12, 1999

(30) Foreign Application Priority Data

Feb. 18, 1998 (JP) .................................. 10-035929

(51) Int. Cl.$^7$ ..................................... G03B 27/42
(52) U.S. Cl. ............................................. 355/53
(58) Field of Search ................... 355/30, 53, 67; 356/401; 318/687; 250/548, 559.26; 430/30, 22; 425/174.4

(56) References Cited

U.S. PATENT DOCUMENTS

| | | | |
|---|---|---|---|
| 4,676,649 | * 6/1987 | Phillips | 356/401 |
| 5,194,893 | 3/1993 | Nishi | 355/53 |
| 5,581,324 | * 12/1996 | Miyai et al. | 355/53 |
| 5,773,953 | * 6/1998 | Ukaji et al. | 318/687 |
| 5,815,246 | * 9/1998 | Sperling et al. | 355/53 |
| 5,858,587 | * 1/1999 | Yamane et al. | 430/22 |
| 5,877,843 | * 3/1999 | Takagi et al. | 355/30 |

* cited by examiner

Primary Examiner—Glenn W. Brown
Assistant Examiner—E P LeRoux
(74) Attorney, Agent, or Firm—Fitzpatrick, Cella, Harper & Scinto (57) ABSTRACT

An exposure apparatus includes an illumination system including an optical element and an inside movable portion, and a driving mechanism for driving the movable portion. The driving mechanism includes at least one of a non-contact type bearing and a non-contact type motor. The illumination system can be placed in a predetermined gas ambience, while the movable portion can be placed in the same gas ambience.

24 Claims, 9 Drawing Sheets

EXPOSURE APPARATUS AND DEVICE MANUFACTURING METHOD

FIELD OF THE INVENTION AND RELATED ART

This invention relates to an exposure apparatus and a device manufacturing method using the same. More particularly, the invention is concerned with an exposure apparatus or an illumination system therefor having a movable portion such as a variable blind or zoom lens, for example. In another aspect, the invention is directed to a device manufacturing method using such an exposure apparatus.

Device manufacturing technology for the production of semiconductor devices, for example, has advanced remarkably and, along this trend, microprocessing techniques have improved considerably. Particularly, as regards optical processing techniques, it has accomplished a microprocessing technique of a submicron order resolution. The resolution can be improved by one of a method in which the numerical aperture (NA) of an optical system is adjusted while holding an exposure wavelength fixed and a method in which the exposure wavelength is shortened.

As regards the latter, the exposure wavelength has been changed from i-line (365 nm) to a recent KrF excimer laser having an emission wavelength of ultraviolet rays of about 248 nm. Further attempts are being made for next generation exposure light sources, using ArF excimer lasers having an emission wavelength of about 193 nm or using vacuum ultraviolet rays or soft X-rays (hereinafter, generally "X-rays") having shorter wavelengths.

It is known that, when ultraviolet rays are used as an exposure light source, as a result of continued operation of the apparatus for a long term, there occurs deposition of ammonium sulfide ($NH_4$) or silicon dioxide ($SiO_2$) on the surface of an optical element disposed along a light path, damaging the optical characteristic notably. This phenomenon is attributable to a chemical reaction of chemical matter such as ammonia $NH_3$, a sulfurous acid $SO_2$ or a Si compound contained in the ambience around the optical element, caused by irradiation with ultraviolet rays. In an attempt to prevent such deterioration of optical elements, the whole optical path of the illumination system is purged by an inert gas such as nitrogen or clean dry air, for example.

On the other hand, in order to meet a further enlargement of a chip size of semiconductor devices, the exposure method itself is being gradually changed from a step-and-repeat method in which a mask pattern is printed repeatedly with intervention of stepwise motion, to a step-and-scan method in which exposure is made while scanningly moving a mask and a wafer, followed by sequential movements to subsequent shots. In an exposure apparatus according to this step-and scan method, the exposure field has a slit-like shape and, therefore, there is an advantage that the exposure area can be enlarged without enlargement in the size of a projection optical system.

Generally, in such an exposure apparatus, there is a variable blind disposed along the optical path of an illumination system, for regulating the range of illumination for illuminating a mask having a circuit pattern formed thereon. This blind may comprise light blocking plates which are operable to set an illumination region of a rectangular shape as desired, in accordance with the type of the mask used. Specifically, step-and-repeat type exposure apparatuses may include a variable blind having light blocking plates with respect to a direction perpendicular to the mask and wafer scan direction, for setting an illumination range corresponding to the chip size as well as light blocking plates with respect to the scan direction, being movable in synchronism with the scan for variably setting the illumination range to a pattern region in the mask scan direction. An example is disclosed in U.S. Pat. No. 5,194,893.

A driving mechanism for such a variable blind may comprise a drive source and guides for regulating movement directions of the light blocking plates. Generally, the guide may comprise a contact type straight guide in which balls or rollers rotate or circulate while being in contact with a guide surface inside the guide. The drive source may generally comprise an output shaft rotation type motor and a feed screw. A driving mechanism based on such sliding motion or rolling motion may assure good positioning precision and easy driving speed control. On the other hand, at the guide, at the feed screw and at bearing elements inside the rotary motor, use of a lubricant agent such as grease is necessary to prevent wearing.

SUMMARY OF THE INVENTION

A lubricant agent contains chemical matters which may be deposited on an optical element, as described hereinbefore. These chemical matters gradually scatter into the ambient gas inside the purged space of the illumination system. As a result of operation of the exposure apparatus for a long term, therefore, these matters will be deposited on the optical element or elements, causing continuing deterioration such as a decrease of illuminance or non-uniformness of illumination, in mask illumination. Thus, it raises a problem peculiar to the exposure apparatus that chemical matters contained in grease or the like used for a driving mechanism inside the illumination system are adhered to optical elements due to intense illumination, damaging the optical performance. Further, there is another problem that a driving mechanism having sliding or rolling components easily creates particles which may be deposited to adjacent optical elements to cause non-uniformness of illumination.

In order to avoid these problems, a movable portion including a driving mechanism may be isolated from the purged space and it may be cleaned appropriately or may be replaced by a fresh one. However, such a maintenance operation leads to a decrease of operation efficiency of the apparatus. Also, addition of optical elements to the illumination system causes a decrease of illumination efficiency.

It is accordingly an object of the present invention to provide an illumination system and/or an exposure apparatus by which the reliability of the illumination system can be improved and the frequency of maintenance can be decreased.

It is another object of the present invention to provide a device manufacturing method using such a exposure apparatus.

In accordance with an aspect of the present invention, there is provided an exposure apparatus, comprising: an illumination system having a movable portion; and a driving mechanism for said movable portion, said driving mechanism including at least one of a non-contact type bearing and a non-contact type motor.

In accordance with another aspect of the present invention, there is provided an illumination system, comprising: an optical element disposed in an ambience of one of an inert gas and clean air; a movable portion disposed in said ambience; and a driving mechanism for said movable portion, said driving mechanism including at least one of a non-contact type bearing and a non-contact type motor.

In accordance with a further aspect of the present invention, there is provided a device manufacturing method including an exposure process using an exposure apparatus as recited above. The method may further include a step for applying a photoresist to a substrate before the exposure process, and a step for developing the photoresist after the exposure process.

In accordance with the present invention, a driving mechanism for a movable portion of an illumination system uses a non-contact type bearing or a non-contact type motor having no sliding or rolling portion. This removes the necessity of using a lubricant agent such as grease, and it prevents emission of chemical matters causing damage of optical elements. The reliability of the illumination system is improved, and the frequency of maintenance is reduced.

The same gaseous fluid as an ambience gas may be used as a lubricant gas for the gas bearing. This avoids the necessity of isolating the movable portion from the purged space of the optical system. The reliability and maintenance facilitation are further improved.

In accordance with a device manufacturing method according to the present invention, because of improved illumination reliability or decreased maintenance frequency, high precision devices can be produced at higher productivity and lower cost.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
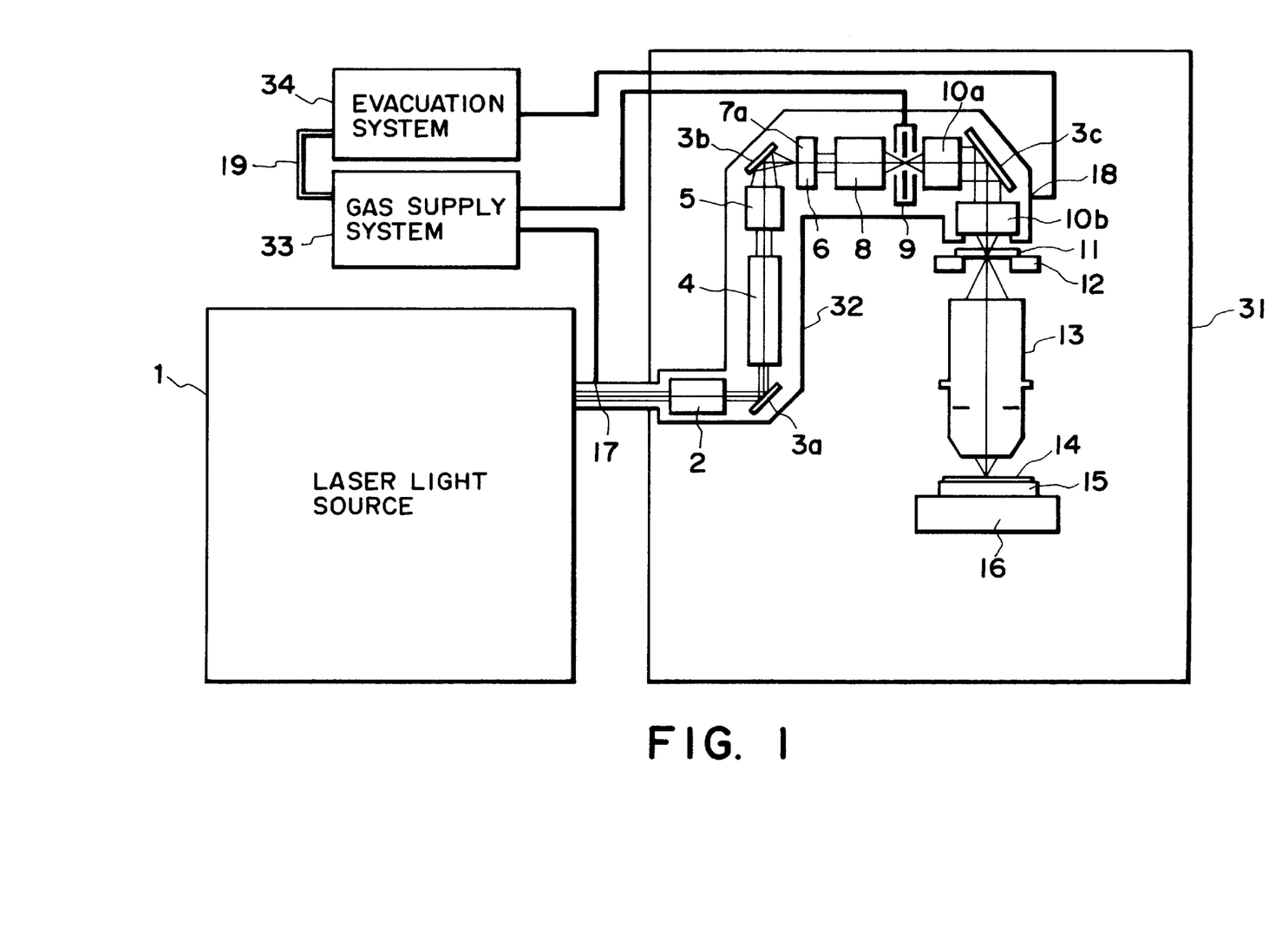
FIG. 1 is a schematic view of a general structure of an exposure apparatus using ultraviolet rays (excimer laser), according to a first embodiment of the present invention.

FIG. 1 is a schematic view for explaining the structure of a projection exposure apparatus. Denoted in the drawing at 1 is an ultraviolet laser light source which comprises a KrF excimer laser having an emission wavelength of about 248 nm or an ArF excimer laser having an emission wavelength of about 193 nm. A laser beam emitted from this light source is directed to an illumination system 32 of a major assembly 31 of the exposure apparatus. The illumination system 32 has various optical elements disposed in a closed space, the inside of which is purged by a predetermined ambience.

Details of the illumination system will be described below. The light beam incident thereon is directed to a beam adjusting system 2 for adjusting the beam into a desired optical axis state, and to a mirror 3a, by which it is directed to a shaping optical system 4 for transforming the beam into a predetermined beam shape. The light emerging from this optical system goes via a condenser lens 5 and a mirror 3b and enters an optical integrator 6. The optical integrator 6 comprises a plurality of small lenses disposed in a two-dimensional array. Secondary light sources 7 are defined adjacent to the light exit surface of the integrator. The light rays from the secondary light sources are collected by a first light converging lens 6. Adjacent to a plane containing this point of light convergence and perpendicular to the optical axis, there is a variable blind 9 disposed for determining the illumination range. Details of it will be described later.

At least one of the condenser lens 5 and the first light converging lens 8 comprises a zooming optical system, and it has a lens driving mechanism for moving at least one of the lenses constituting the zooming optical system. This lens driving mechanism comprises at least one of (preferably, both of) a non-contact type bearing and a non-contact type linear motor, using no grease.

The light from the first light converging lens 8 goes via a second light converging lens front group 10a, a mirror 3c, and a second light converging lens rear group 10b, and it uniformly illuminates a pattern surface of a mask 11 placed on a mask stage 12. The pattern bearing surface of the mask 11 is placed in an optically conjugate relation with the plane perpendicular to the optical axis and containing the point of light convergence as defined by the first light collecting lens 8. Therefore, by using the variable blind 9, the illumination range upon the mask can be determined as desired. Further, use of the zooming lens system effectively enables adjustment of magnification of the illumination system, for example.

Projection optical system 13 serves to project the pattern of the mask 11 onto a wafer 14 in a reduced scale. The wafer 14, which is a substrate to be exposed, is held by a wafer chuck 15 mounted on a wafer stage 16. Here, the mask stage 12 and the wafer stage 16 can be scanningly moved in synchronism with each other, at a speed ratio corresponding to the reduction magnification of the projection optical system. Further, in synchronism with the stage scan movement, the aperture width of the variable blind 9 in the scan direction is changed to thereby prevent exposure of an adjacent shot region. In this manner, the whole of the pattern of the mask 11 is transferred and printed on a single shot region of the wafer 14. This operation is repeated and, in accordance with the step-and-scan method, mask patterns are printed sequentially on the shot regions of the wafer.

Denoted at 33 is a gas supplying system for supplying a purge gas for purging the inside closed space of the illumination system 32, from an inlet 17. The supplied gas flows through the illumination system 32, and it is discharged from an outlet 18. From there, it is directed to an evacuation or discharging system 34. There is a purging gas recycling means 19 for purifying the discharged purge gas and for circulating it from the discharging system 34 back to the gas supplying system 33. With the provision of this recycling system, if the purge gas is an expensive gas such as helium, for example, the running cost can be reduced significantly.

As regards the gas to be used, preferably it may consist of an inert gas (e.g., nitrogen, helium, argon) or clean dry air. Provided that all components inside the purged space are sufficiently clean from the viewpoint of chemicals and particles, use of a clean dry air as purge gas is effective to isolate them from the atmosphere, other than the purge gas, that is, to prevent entering of chemical matters of optical element deterioration from the atmosphere. Further, from the viewpoint of preventing adhesion of matters such as silicon dioxide $SiO_2$ or the like onto optical elements due to the presence of oxygen, use an inert gas such as nitrogen, helium or argon is effective. Furthermore, if an ArF excimer laser is used as a light source, since the remaining oxygen density should be made low, use of inert gas is preferable.

Figure 2:
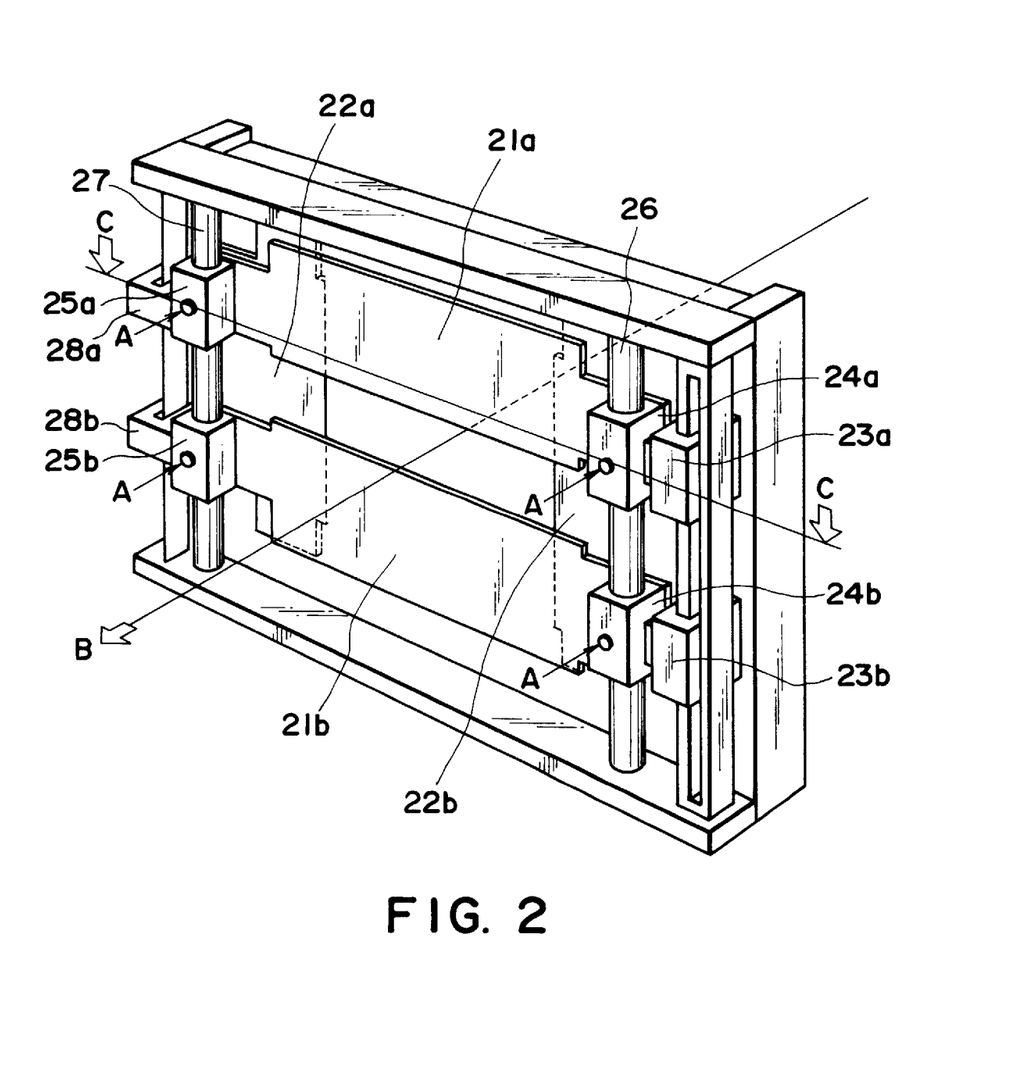
FIG. 2 is a perspective view of a blind used in the first embodiment of the present invention.
Figure 3:
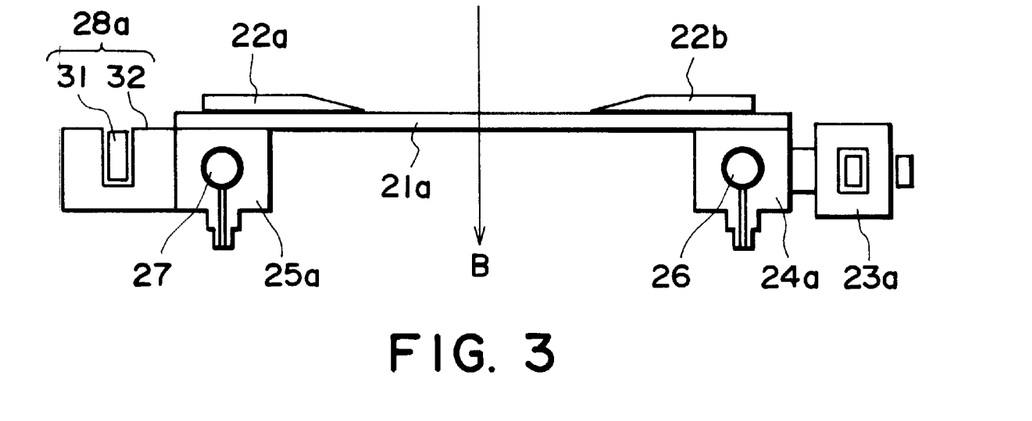
FIG. 3 is a sectional view taken along a line C—C in FIG. 2.
Figure 4:
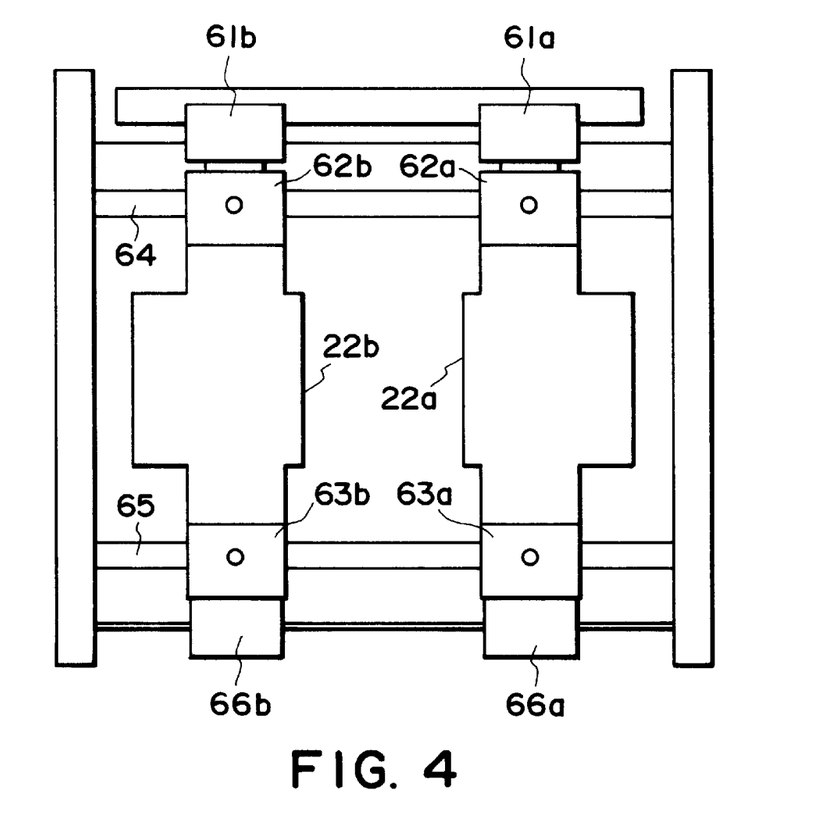
FIG. 4 is a rear view of the blind of FIG. 2.

Next, the variable blind will be explained. FIG. 2 illustrates details of the structure of the variable blind 9. FIG. 3 is a sectional view taken along a line C—C in FIG. 2. FIG. 4 is a rear view of the blind of FIG. 2. Laser light from the light source is projected in a direction of an arrow B as illustrated. Basically, the blind comprises four light blocking plates 21a, 21b, 22a and 22b, and a driving mechanism therefor. The light blocking plates 21a and 21b serve to define the aperture width of the illumination slit along the scan direction. The light blocking plates 22a and 22b serve to determine the width along a direction perpendicular to the scan direction. The light blocking plates 21a and 21b and the light blocking plates 22a and 22b are disposed orthogonally. Denoted at 23b is a linear motor, and denoted at 24b and 25b are gas bearings. Denoted at 28b is a position detector for the light blocking plate 21b. As shown in FIG. 3, position detector 28a comprises a linear encoder having a scale 31 and a detecting element 32. The linear encoder has such a structure that the scale 31 and the detecting element 32 are disposed with a predetermined clearance therebetween. Further, denoted at 61a and 61b in FIG. 4 are linear motors, and denoted at 62a, 62b, 63a and 63b are gas bearings. Denoted at 64 and 65 are guides, and denoted at 66a and 66b are position detectors.

Here, a driving mechanism for the light blocking plates 21a and 21b will be described. Denoted at 23a is a non-contact type linear motor and, since it has no contact movable portion, use of a lubricant agent such as grease is unnecessary. The movable portion of this linear motor is connected to a gas bearing 24a. The light blocking plate 21a is held by gas bearings 24a and 25a, and it is movable along guides 26 and 27. Lubricant gases are supplied to these gas bearings 24a and 25a from portions A in the drawing, so that a small clearance is maintained between it and the guide 26 or 27. Denoted at 28a is a position detector for the light blocking plate 21a. On the basis of an output signal of this detector, a control system (not shown) controls the linear motor 23a. A driving mechanism for the light blocking plate 21b is similar to that of the light blocking plate 21a.

Figure 5A:
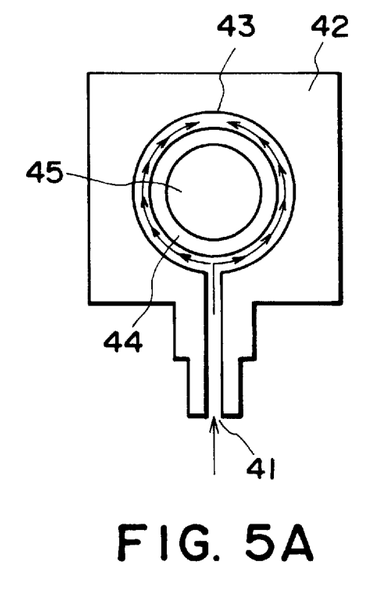
FIGS. 5A and 5B are schematic views, respectively, for explaining the structure of a gas bearing.
Figure 5B:
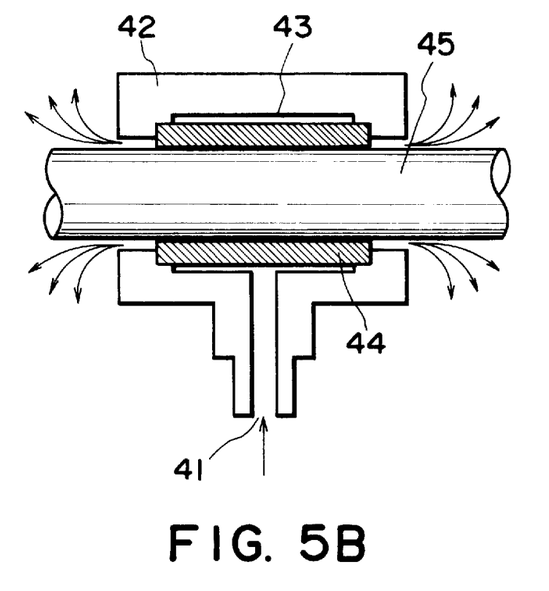

Referring to FIGS. 5A and 5B, details of the gas bearings 24a and 25a will be described. FIG. 5A is a sectional view of the guide 26 or 27 along a plane orthogonal to the optical axis direction. FIG. 5B is a sectional plane along the optical axis direction. Denoted in these drawings at 41 is a supply port for lubricant gas. Denoted at 42 is a bearing housing, and denoted at 43 is a gas flowpassage formed in the housing. Denoted at 44 is a bearing pad made of a porous material having a multitude of fine gas-flow pores. Denoted at 45 is a guide shaft of a circular sectional shape. Compressed air supplied into the housing 42 flows along the gas flowpassage as illustrated by arrows in FIG. 5A, and surrounds the outside circumference of the bearing pad 44 of porous material. Since the gas-flow pores of the porous material are very small, as the compressed air passes it, the porous material functions as a throttle or restriction member. After passing it, the air enters the gap between it and the shaft 45, such that due to static pressure of the gas a predetermined clearance is maintained between the shaft 45 and the bearing pad 44. The air passing this clearance between the shaft 45 and the pad 44 is finally discharged from the opposite ends of the housing 42, as illustrated by arrows in FIG. 5B. The gas bearings 62a, 62b, 63a and 63b have a similar structure.

In this embodiment, the gas bearings use a porous material restriction member. However, the present invention is usable with a gas bearing of any other form, such as an orifice restriction, a slot restriction, self-regulation restriction, surface restriction or capillary restriction, for example. The same applies to other embodiments to be described below.

As regards the lubricant gas for the gas bearing, in this embodiment, the purge gas supplying system 33 supplies a portion therefor. However, a separate supplying system independent of the purge gas supplying system may be provided. As long as the bearing lubrication gas consists of the same gas as the purge gas, the driving mechanism for the variable blind can be disposed inside the purge space of the illumination system without disturbing the purge environment.

Figure 6:
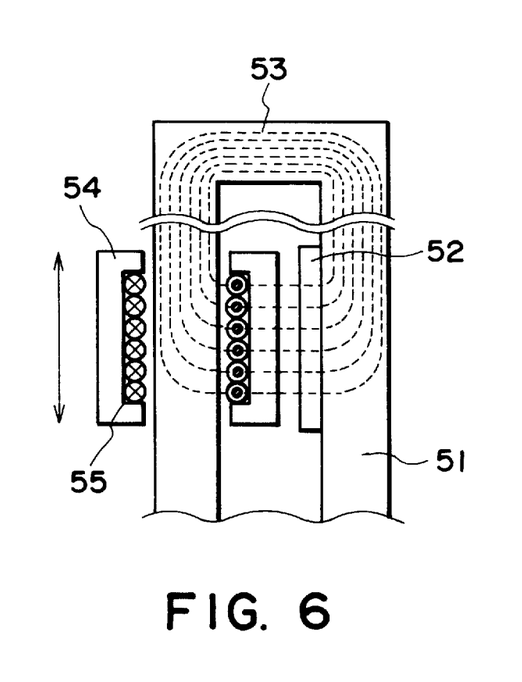
FIG. 6 is a schematic view for explaining the structure of a non-contact type linear motor.

Referring now to FIG. 6, details of the non-contact linear motor 23a will be described. Denoted in the drawing at 51 is a yoke, which is made of a magnetic material, and denoted at 52 is a permanent magnet. Denoted at 54 is a housing, and denoted at 55 are coils. The permanent magnet 52 and the yoke 51 cooperate to produce a magnetic circuit as depicted by broken lines 53. When a predetermined electric current is supplied from a voltage source to the coils 55 accommodated in the housing 54, the housing 54 moves together with the coils 55 in a direction of an arrow in the drawing. Here, while a moving coil type linear motor is provided in this example, a moving magnet type linear motor may be provided. Since the housing 54 moves along the guide 26 or 27 described hereinbefore, the coils 55 and the yoke 51 are kept out of contact with each other, and a constant clearance is maintained therebetween. Linear motors 61a and 61b may have a similar structure.

An important feature of the present invention resides in the use of a bearing structure using no lubricant agent. Examples of such a bearing may be a gas bearing and, in addition to it, a magnetic bearing. While the embodiment has been described with reference to an example wherein a gas bearing is used, the gas bearing may be replaced by a magnetic bearing. The same applies to embodiments to be described below.

As regards the driving mechanism for the variable blind or for the zooming optical system, a best way may be the use of both a non-contact bearing and a non-contact linear motor. However, the use of at least one of them will be sufficient to provide a significantly improved exposure apparatus. This is also true with the cases of embodiments to be described below.

In this embodiment, as described above, a driving mechanism for a variable blind or a zooming optical system uses at least one of (preferably, both of) a non-contact type bearing and a non-contact type linear motor which does not need the use of a lubricant agent such as grease, and the mechanism does not include any sliding or rolling component. With this structure, there is no emission of chemical matters, or damage to optical elements. Also, creation of particles is reduced remarkably.

Further, there is no necessity of isolating the mechanism from the purge space of the optical system before and after the movable portion, inside the illumination system. Thus, maintenance for the movable portion is not required. This effectively improves the operation efficiency of the apparatus, reduces the running cost efficiency and increases the illumination efficiency. The throughput of the apparatus is totally improved. The reliability of the illumination system and workability for the maintenance are enhanced.

The same gaseous fluid as that used for purging the illumination system may be used for a lubricant gas of the gas bearing. This removes the necessity of isolating the movable portion from the purged space of the illumination system. The reliability and maintenance easiness are improved more.

Next, another example of a variable blind will be described. Since the general structure of a projection exposure apparatus used with this example is similar to that of the FIG. 1 embodiment, a description therefor will be omitted here.

Figure 7:
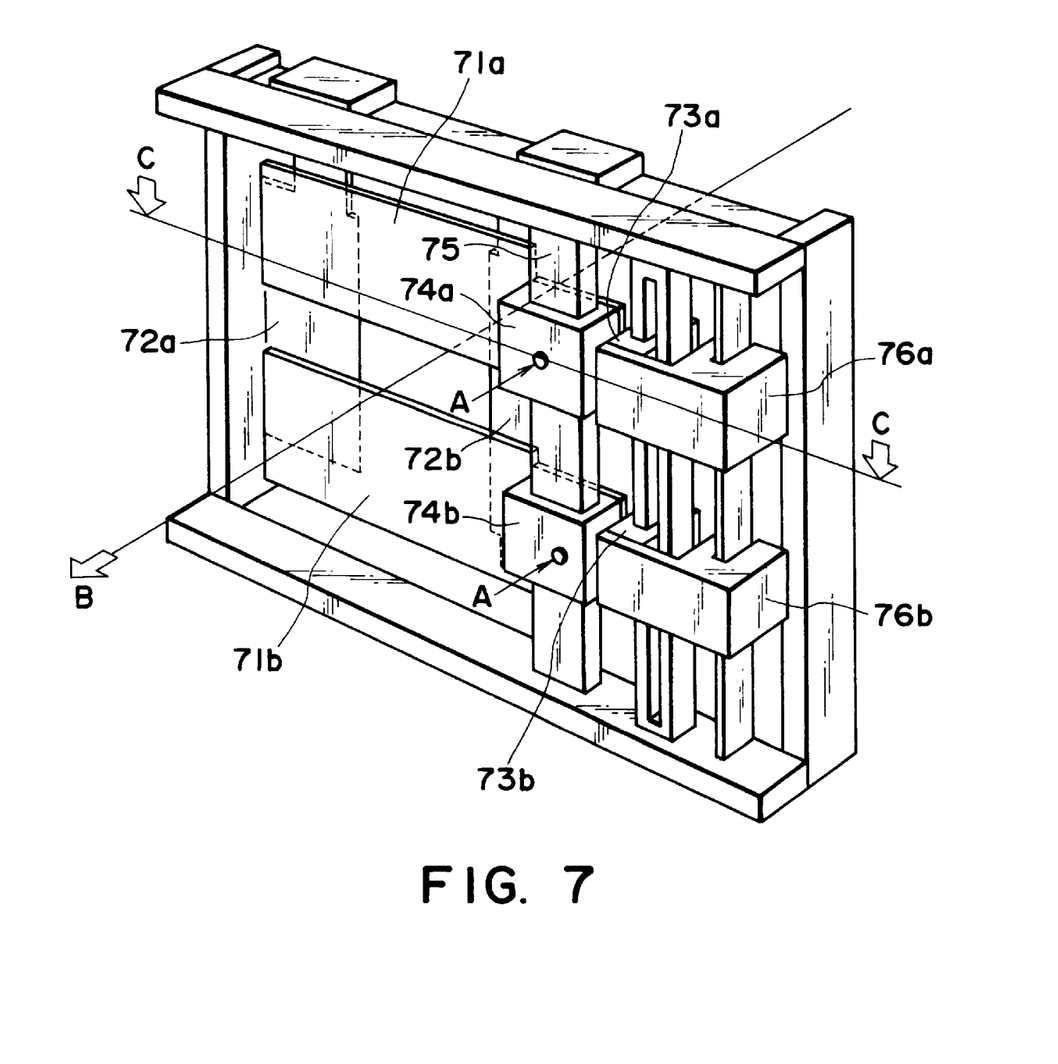
FIG. 7 is a perspective view of a blind used in a second embodiment of the present invention.
Figure 8:
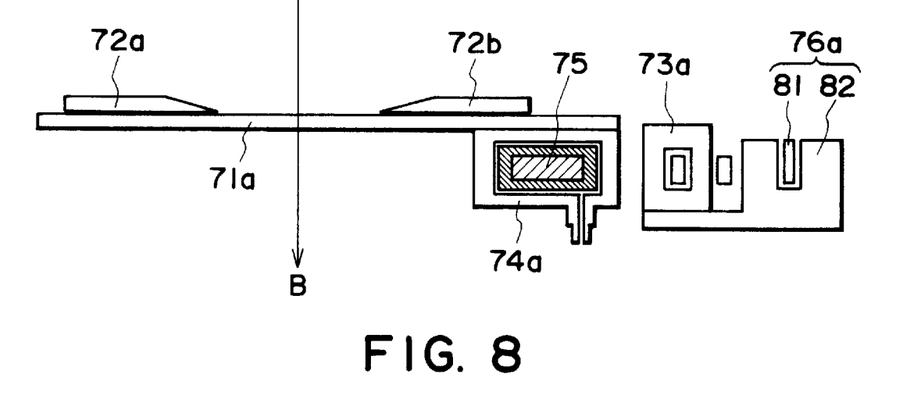
FIG. 8 is a sectional view taken on line C—C in FIG. 7.
Figure 9:
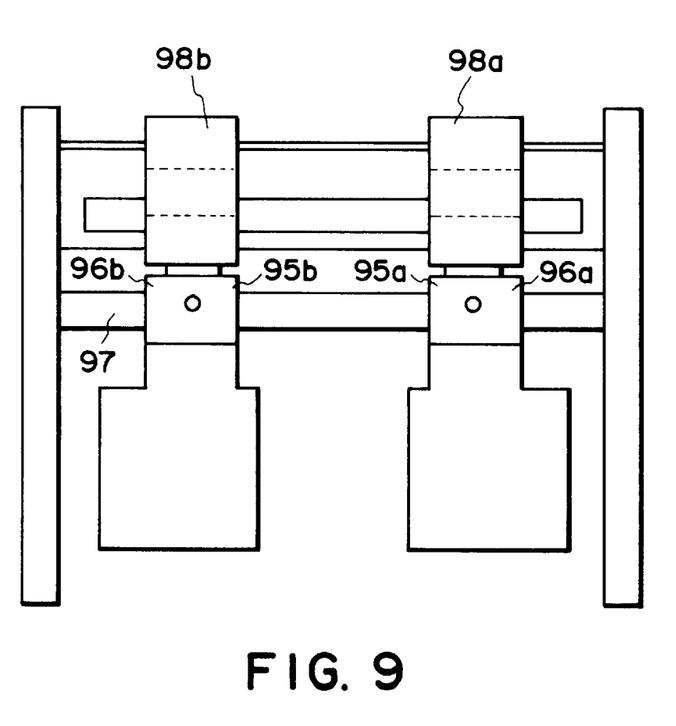
FIG. 9 is a rear view of the blind of FIG. 7.

FIG. 7 is a schematic view for explaining details of the structure of a variable blind 9. FIG. 8 is a sectional view taken on line C—C in FIG. 7. FIG. 9 is a rear view. Denoted in these drawings at 71a and 71b are light blocking plates which are disposed orthogonally to light blocking plates 72a and 72b, and which are placed close to each other in an optical axis direction. Denoted at 73b is a linear motor, and denoted at 74b is a gas bearing. Denoted at 76b is a position detector for the light blocking plate 71b. Denoted at 95a and 95b are linear motors, and denoted at 96a and 96b are gas bearings. Denoted at 97 is a guide, and denoted at 98a and 98b are position detectors.

Driving mechanisms for the light blocking plates 71a and 71b will now be described. Linear motor 73a is connected to a gas bearing 74a. The light blocking plate 71a is held by a gas bearing 74a, and it is movable along a guide 75. Lubricant gases are supplied to the gas bearing 74a, as shown at arrows A in the drawing, by which a small clearance is maintained between it and the guide 75. In accordance with an output signal of a position detector 76a for the light blocking plate 71a, a controller controls the linear motor 73a. The driving mechanism for the light blocking plate 71b has a similar structure as that for the light blocking plate 71a.

Figure 10A:
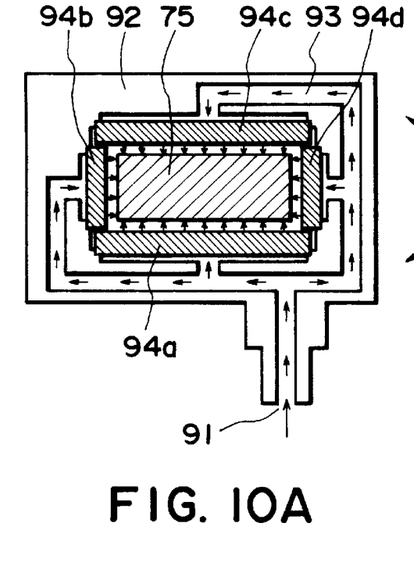
FIGS. 10A and 10B are schematic views, respectively, for explaining the structure of a gas bearing.
Figure 10B:
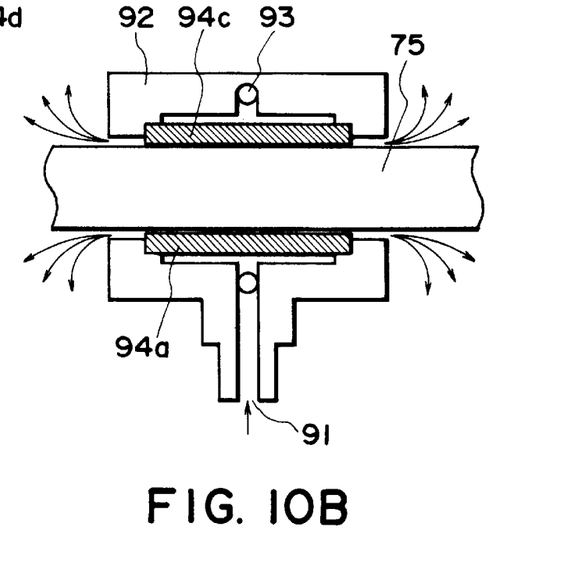

Referring to FIGS. 10A and 10B, details of the gas bearing 74a will be described. Denoted in these drawings at 91 is a gas supply port for lubricant gas. Denoted at 92 is a bearing housing, and denoted at 93 is a gas flowpassage formed in the housing. Denoted at 94a–94d are bearing pads made of a porous material. Denoted at 75 is a guide shaft of a rectangular sectional shape. Compressed air supplied into the housing 92 flows along the gas flowpassage as illustrated by arrows in FIG. 10A, and surrounds the outside circumferences of the bearing pads 94a–94d of porous material. Since the gas-flow pores of the porous material are very small, as the compressed air passes it, the porous material functions as a throttle or restriction member. After passing it, the air enters the gap between it and the surface of the shaft 95, such that due to static pressure of the gas a predetermined clearance is maintained between the shaft 75 and the bearing pads 94a–94d. The air passing this clearance between the shaft 75 and the porous pads 94a–94d are finally discharged from the opposite ends of the housing 92, as illustrated by arrows in FIG. 10B.

When a guide having a rectangular sectional shape is used as in this embodiment, a sufficient bearing rigidity is assured relative to a moment around the guiding axis. Thus, even use of only one for the light blocking plates 71a, 71b, 72a and 72b will provide sufficient strength.

Next, an embodiment of a step-and-repeat type X-ray exposure apparatus using X-rays (generally referred to as vacuum ultraviolet rays and soft X-rays, for example), having a wavelength shorter than the excimer ultraviolet rays as described, will be explained.

X-rays are attenuated very largely by a gas, as is well known in the art. In consideration of it, in an X-ray exposure apparatus, the whole structure including an illumination system is accommodated in a gas-tight chamber. The inside of the chamber is filled with a reduced pressure ambience being purged by an inert gas, or it is maintained in an ultra-high vacuum state. There are inconveniences such as described at the introduction of this specification, and contaminations of chemical matters may be adhered to an X-ray extracting window or an optical element such as an alignment measuring optical system. In consideration of the above, in this embodiment, a driving mechanism for a variable blade, which serves to define an X-ray irradiation range on an X-ray mask, uses a non-contact bearing and a non-contact linear motor.

Figure 11:
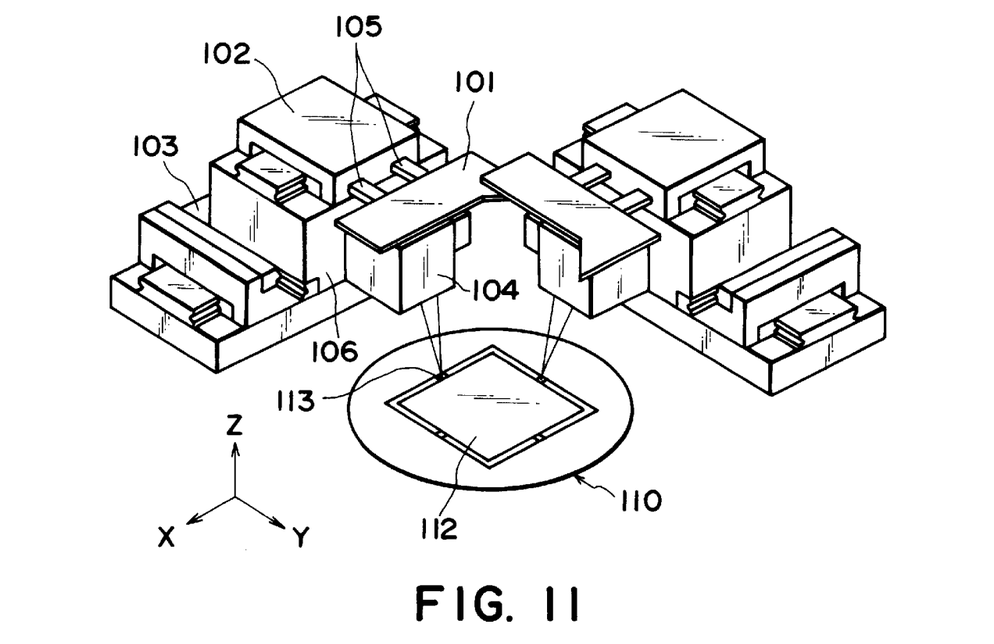
FIG. 11 is a schematic view of a main portion of an X-ray exposure apparatus.

FIG. 11 illustrates the structure around the variable blind, in this X-ray exposure apparatus. For determining the illumination range for the X-ray mask, a variable blind having four light blocking plates is disposed on a path of an X-ray beam. Only two blades of the variable blind are illustrated in FIG. 11, but actually there are four blades.

The light blocking plates 101 comprise X-ray blocking members made of glass or lead, for example, and each has a thickness (e.g., 100 microns) sufficient for intercepting the projected X-rays. Each light blocking plate is connected to a driving mechanism, causing translation motion of the same.

The driving mechanism will be described in greater detail. The light blocking plate 101 is connected to a translation motion stage 102 for moving the light blocking plate 101 in the X direction in the drawing, through arms 105. Mounted on a side face portion of a base 106 of this translation motion stage 102, below the arms 105, is an alignment optical system pickup 104 which emits an alignment beam for alignment of the X-ray mask 110. Thus, the alignment optical system pickup 104 and the light blocking plate 101 are in a fixed positional relation with each other with respect to the Y direction in the drawing. Also, they are so arranged that the X-ray beam as projected in the Z direction in the drawing is blocked by the light blocking plate 101, and it does not impinge on the alignment optical system pickup 104. The light blocking plate translation motion stage 102 is connected to an X-Y stage 103 for producing two-dimensional motion of the alignment optical system pickup 104 in the X and Y directions.

For exposure and transfer operation, the positions of the four light blocking plates are adjusted by means of the driving mechanisms to define an illumination range so that only a circuit pattern region 112 of the X-ray mask 110 as well as the region of mask alignment marks 113 can be irradiated with X-rays. A wafer (not shown) which is a substrate to be exposed is disposed close to the X-ray mask, and the mask pattern within the thus defined illumination range is transferred to the wafer by exposure.

The translation motion stage 102 and the X-Y stage 103, which provide a driving mechanism for the variable blind, use a non-contact linear motor and a non-contact bearing (gas bearing or magnetic bearing) using no lubricant agent such as grease. When a gas bearing is used, a lubricant gas of the same gas as the ambience gas (inert gas) is used. This effectively prevents adhesion of contaminations to the X-ray extracting window (not shown) or to optical elements of the alignment optical system pickup.

Next, an embodiment of a semiconductor device manufacturing method, which uses an exposure apparatus according to any one of the preceding embodiments, will be explained.

Figure 12:
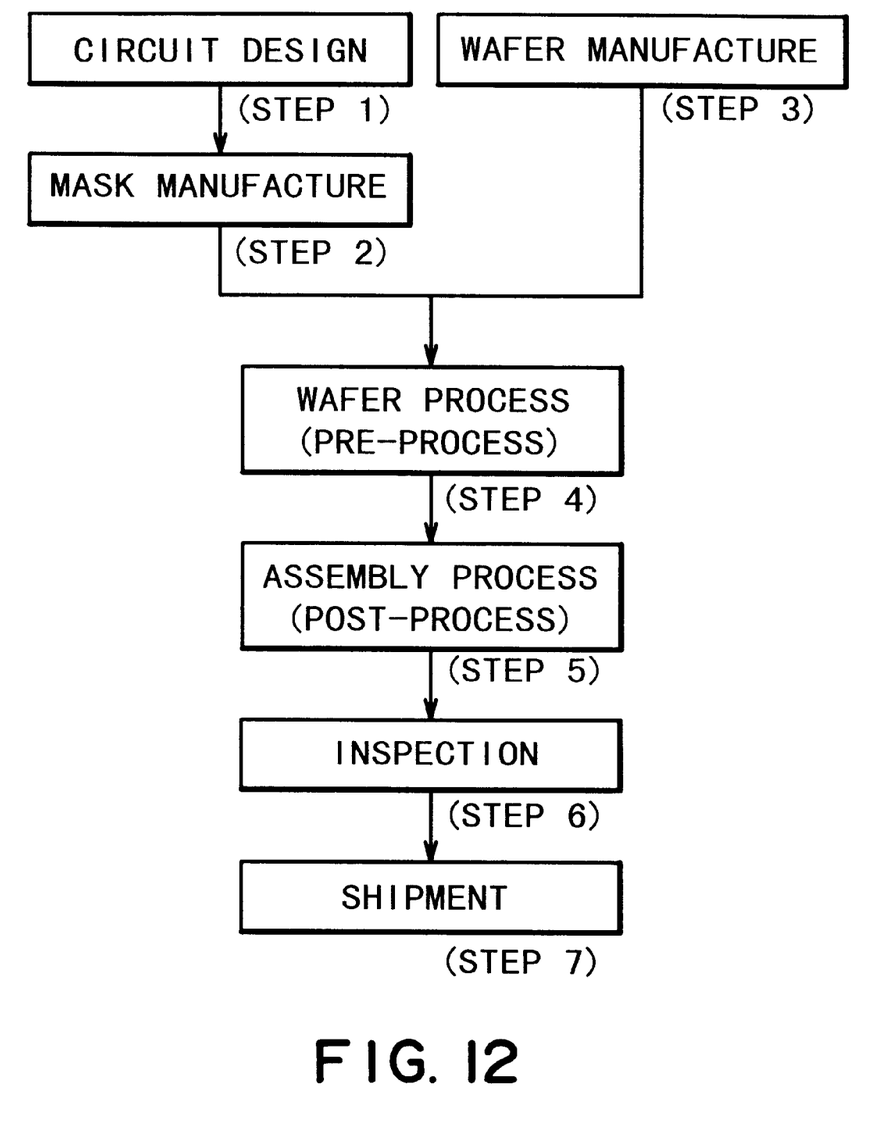
FIG. 12 is a flow chart of a device manufacturing procedure according to an embodiment of the present invention.

FIG. 12 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 13:
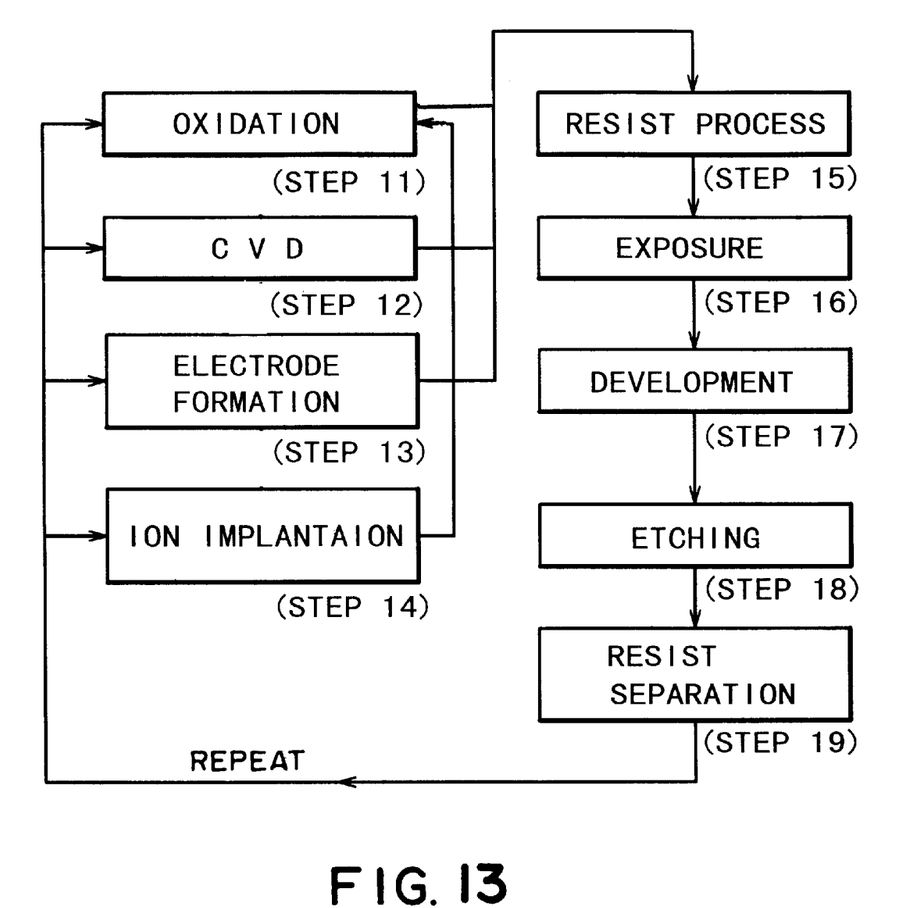
FIG. 13 is a flow chart for explaining details of a wafer process included in the procedure of FIG. 12.

FIG. 13 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured at high productivity and thus at low cost.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
an illumination system including an optical element and an inside movable portion, said movable portion comprising a variable blind;
means for filling a space, for accommodating said illumination system, with a predetermined inert gas ambience; and
a driving mechanism for driving said movable portion, said driving mechanism including at least one of a non-contact type bearing and a non-contact type motor, said non-contact bearing comprising a gas bearing with its lubricant gas being the same as that of the predetermined inert gas ambience, the inert gas consisting of one of nitrogen, helium and argon.

2. An apparatus according to claim 1, wherein said illumination system has at least one of a variable blind and a lens disposed along a light path, and said driving mechanism moves at least one of said variable blind and said lens.

3. An apparatus according to claim 2, wherein said non-contact bearing comprises one of a gas bearing and a magnetic bearing.

4. An apparatus according to claim 3, wherein said non-contact motor comprises a linear motor having a coil and a magnet.

5. An apparatus according to claim 1, wherein said movable portion includes said non-contact bearing, and said movable portion is disposed in the predetermined gas ambience.

6. An apparatus according to claim 1, further comprising means for recycling the inert gas.

7. An apparatus according to claim 1, further comprising a first stage for holding and scanningly moving a mask, a projection optical system for projecting a pattern of the mask onto a substrate, and a second stage for holding and scanningly moving the substrate, wherein the pattern of the mask is transferred to the substrate while the mask and the substrate are scanningly moved relative to said projection optical system.

8. An apparatus according to claim 7, wherein said movable portion comprises a variable blind having an aperture width which can be changed in synchronism with the movement of said first stage to change an illumination range for the mask in a scan direction.

9. An apparatus according to claim 7, wherein said movable portion comprises a variable blind having four light blocking plates effective to define an illumination range of a rectangular shape.

10. An apparatus according to claim 1, wherein said non-contact bearing has a bearing structure of one of a circular sectional shape and a rectangular sectional shape.

11. An apparatus according to claim 1, wherein said non-contact bearing comprises a gas bearing having one of a porous material restriction member, an orifice restriction member, a slot restriction member, a self-regulation restriction member, a surface restriction member and a capillary restriction member.

12. An apparatus according to claim 1, wherein said illumination system provides illumination by use of one of ultraviolet rays and X-rays.

13. An apparatus according to claim 1, wherein said illumination system provides illumination by use of one of light of i-line, KrF excimer laser light, ArF excimer laser light and X-rays.

14. An illumination system, comprising:
an optical element disposed in an ambience of one of an inert gas and clean air;
means for filling a space, for accommodating said illumination system, with a predetermined inert gas ambience;
a movable portion disposed in the ambience, said movable portion comprising a variable blind; and
a driving mechanism for driving said movable portion, said driving mechanism including at least one of a non-contact type bearing and a non-contact type motor, said non-contact bearing comprising a gas bearing with its lubricant gas being the same as that of the predetermined inert gas ambience, the inert gas consisting of one of nitrogen, helium and argon.

15. An illumination system according to claim 14, wherein said driving mechanism is one of a driving mechanism for a variable blind disposed along a light path of said optical element and a lens driving mechanism for a zoom lens system of said optical element.

16. A device manufacturing method comprising:
   providing an illumination system including an optical element and an inside movable portion, the movable portion comprising a variable blind;
   filling a space, for accommodating the illumination system, with a predetermined inert gas ambience;
   driving, with a driving mechanism, the movable portion, the driving mechanism including at least one of a non-contact type bearing and a non-contact type motor, the non-contact bearing comprising a gas bearing with its lubricant gas being the same as that of the predetermined inert gas ambience, the inert gas consisting of one of nitrogen, helium and argon; and
   performing an exposure process, using the illumination system, to manufacture a device.

17. A method according to claim 16, further including a step of applying a photoresist to a substrate before the exposure process, and a step of developing the photoresist after the exposure process.

18. A device manufacturing method comprising:
   disposing an optical element in a predetermined inert gas ambience of one of an inert gas and clean air;
   disposing a movable portion in the ambience, the movable portion comprising a variable blind;
   driving the movable portion, with a driving mechanism, the driving mechanism including at least one of a non-contact type bearing and a non-contact type motor, the non-contact bearing comprising a gas bearing with its lubricant gas being the same as that of the predetermined inert gas ambience, the inert gas consisting of one of nitrogen, helium and argon; and
   performing an exposure process, using the optical element, to manufacture a device.

19. A method according to claim 18, further including a step of applying a photoresist to a substrate before the exposure process, and a step of developing the photoresist after the exposure process.

20. An exposure apparatus comprising:
   an optical system including an optical element and being filled with a predetermined inert gas ambience;
   a movable member disposed inside the predetermined inert gas ambience, the movable member comprising a variable blind; and
   a gas bearing for said movable member, wherein a gas that is supplied to said gas bearing is the same as that of the predetermined inert gas, said non-contact bearing comprising a gas bearing with its lubricant gas being the same as that of the predetermined gas ambience, the inert gas consisting of one of nitrogen, helium and argon.

21. An apparatus according to claim 20, further comprising a non-contact type motor for driving said movable member.

22. An apparatus according to claim 20, wherein said movable member comprises one of the variable blind and a lens, disposed along a light path of said optical system.

23. An apparatus according to claim 20, further comprising means for recycling the inert gas.

24. A device manufacturing method comprising:
   providing an optical system that includes an optical element and is filled with a predetermined gas;
   filling a space, for accommodating the optical system, with a predetermined inert gas ambience;
   disposing a movable member inside the predetermined gas, the movable member comprising a variable blind;
   providing a gas bearing for the movable member, wherein a gas that is supplied to the gas bearing is the same as that of the predetermined gas, the non-contact bearing comprising a gas bearing with its lubricant gas being the same as that of the predetermined inert gas ambience, the inert gas consisting of one of nitrogen, helium and argon; and
   performing an exposure process, using the optical system, to manufacture a device.

* * * * *